United States Patent [19]
Natsume

[11] Patent Number: 5,686,736
[45] Date of Patent: Nov. 11, 1997

[54] SRAM CELL HAVING THIN FILM TRANSISTORS AS LOADS

[75] Inventor: Hidetaka Natsume, Tokyo, Japan

[73] Assignee: NEC Corporation, Tokyo, Japan

[21] Appl. No.: 806,704

[22] Filed: Feb. 27, 1997

Related U.S. Application Data

[63] Continuation of Ser. No. 365,951, Dec. 29, 1994, abandoned.

[30] Foreign Application Priority Data

Dec. 30, 1993 [JP] Japan ................... 5-352440

[51] Int. Cl.⁶ ............... H01L 27/108; H01L 27/01; H01L 29/76; H01L 27/11
[52] U.S. Cl. .................. 257/69; 257/350; 257/351; 257/393; 257/903
[58] Field of Search .................. 257/903, 69, 67, 257/904, 393, 350, 351

[56] References Cited

U.S. PATENT DOCUMENTS

| | | | |
|---|---|---|---|
| 5,162,889 | 11/1992 | Itomi | 257/69 |
| 5,331,170 | 7/1994 | Hayashi | 257/903 |
| 5,373,170 | 12/1994 | Pfiester et al. | 257/903 |
| 5,426,324 | 6/1995 | Rajeevakumar | 257/903 |

FOREIGN PATENT DOCUMENTS 0 504 006  9/1992  European Pat. Off. ........... 257/69

OTHER PUBLICATIONS

Chen et al., "Stacked CMOS SRAM Cell," *IEEE Electron Device Letters*, vol. EdL-4, No. 8, Aug. 1983, pp. 272-274.
"16Mbit SRAM Cell Technologies for 2.0V Operation," by Ohkubo et al., IEEE IEDM Technical Digest, pp. 481-484, 1991 no month.

*Primary Examiner*—Mahshid D. Saadat
*Assistant Examiner*—Valencia Martin Wallace
*Attorney, Agent, or Firm*—Sughrue,Mion,Zinn,Macpeak & Seas, PLLC

[57] ABSTRACT

In a SRAM cell including two cross-coupled inverters having an input connected to a first node and an output connected to a second node, each inverter having a load TFT of a first conductivity type and a driving MOS transistor of a second conductivity type, a drain of each of the load TFT's is connected via a connection plug to the corresponding one of the first and second nodes.

13 Claims, 12 Drawing Sheets

P-CHANNEL TFT

N-CHANNEL MOS TRANSISTOR

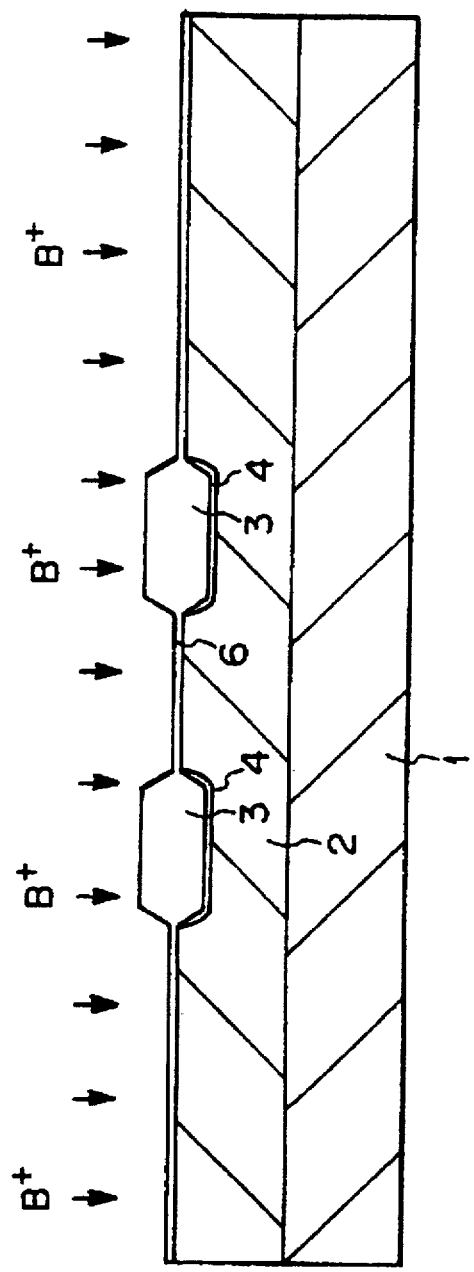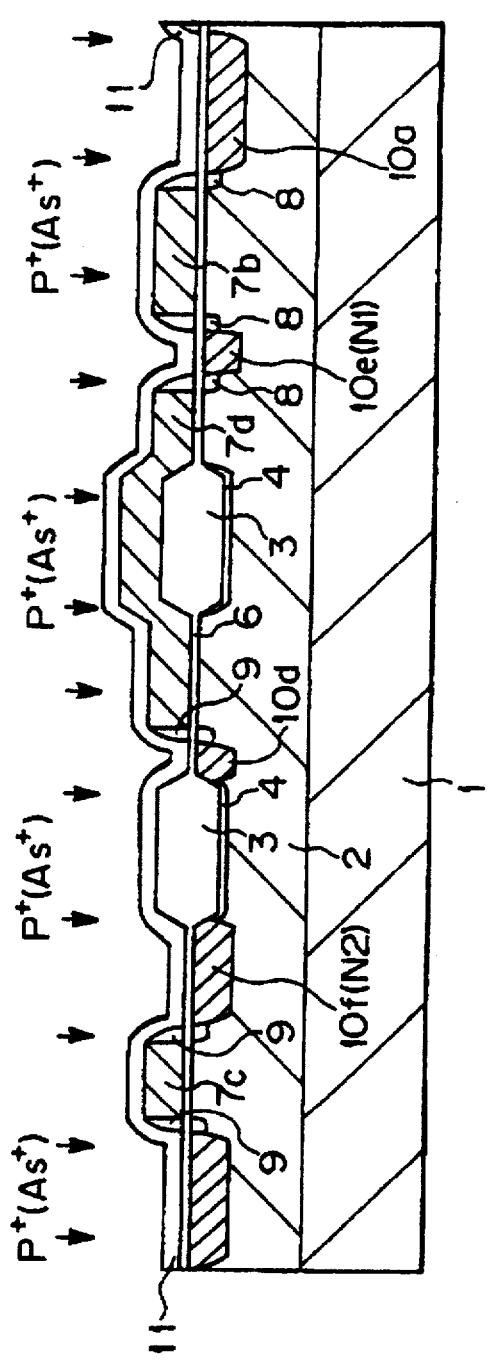
Fig. 9A
Fig. 9B

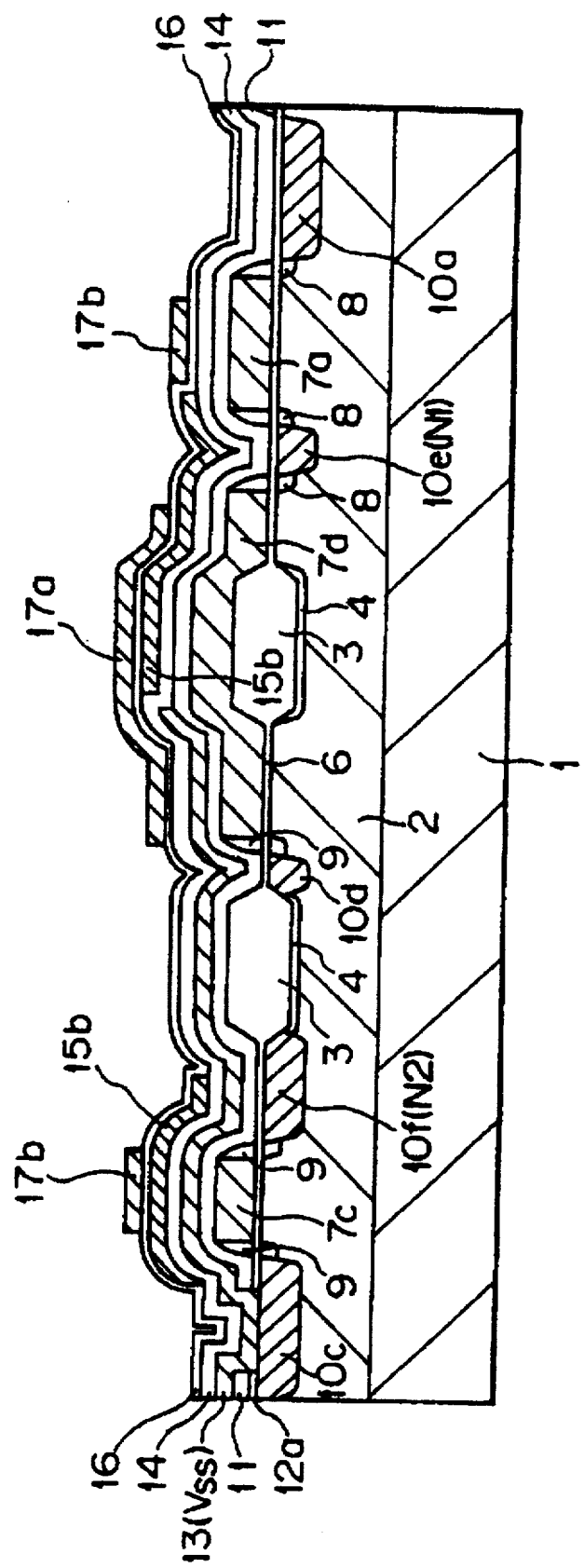

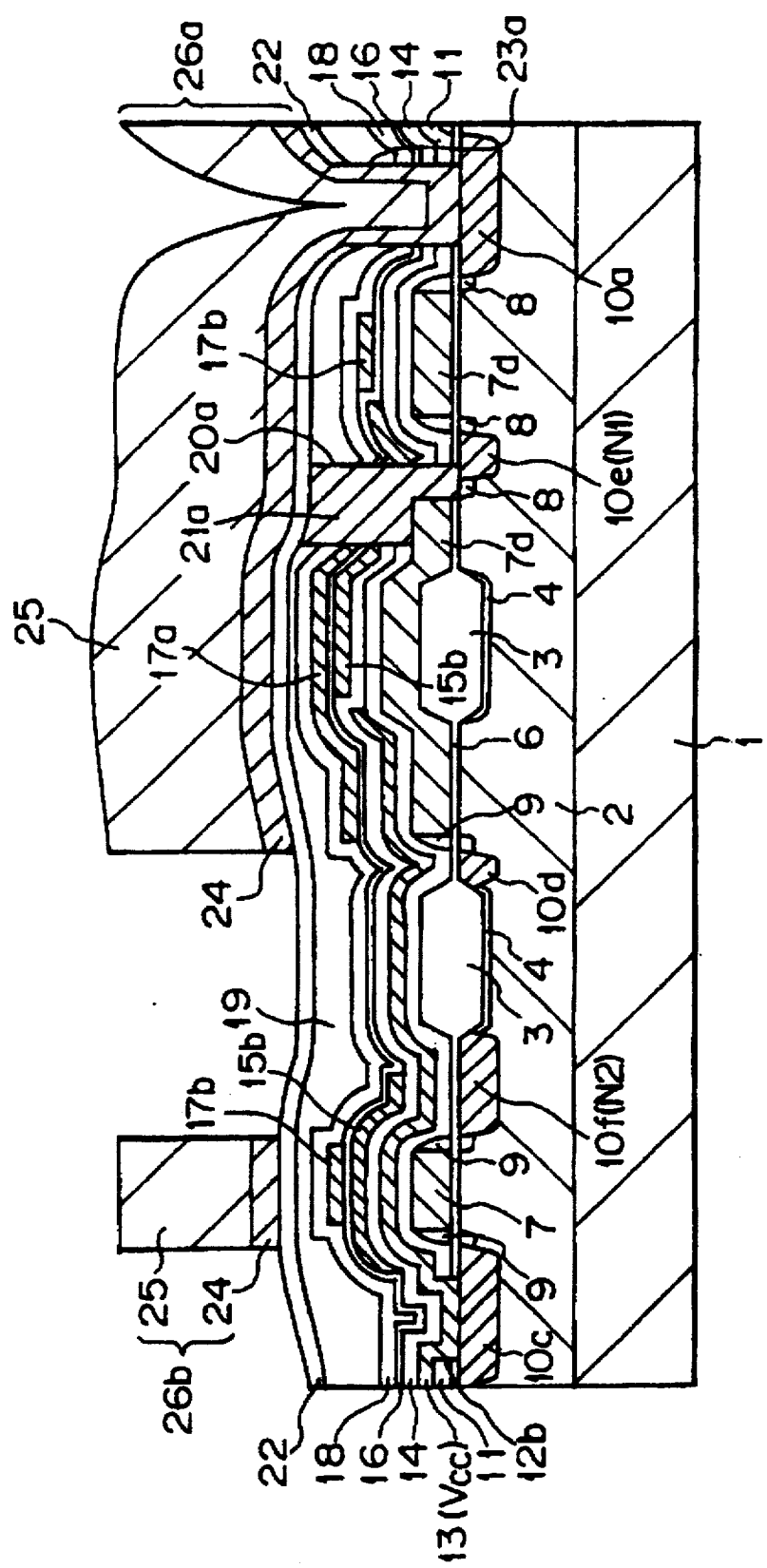

5,686,736

1

SRAM CELL HAVING THIN FILM TRANSISTORS AS LOADS

This is a continuation of application Ser. No. 08/365,951 filed Dec. 29, 1994 now abandoned.

BACKGROUND OF THE INVENTION

1. Field of the Invention

The present invention relates to a static random access memory (SRAM) cell having thin film transistors (TFT's) as loads.

2. Description of the Related Art

Generally, a SRAM cell is constructed by a flip-flop formed by two cross-coupled inverters, and transfer gates connected between the nodes of the flip-flop and data lines. Also, particularly, in a 4 Mbit SRAM device or the like, each of the inverters is constructed by a P-channel load transistor and an N-channel MOS driving transistor.

Also, in the prior art, in order to reduce the cell size, the load transistors are constructed by P-channel TFT's and the driving transistors are constructed by N-channel MOS (bulk) transistors (see H. Ohkubo et al., "16 Mbit SRAM Cell Technologies for 2.0 V Operation", IEEE IEDM Technical Digest pp. 481–484, 1991). This will be explained later in detail.

In the above-mentioned prior art method, however, P$^+$-type impurity diffusion drain regions of load TFT's and N$^+$-type impurity diffusion drain regions of driving MOS transistors are rearranged by a high temperature heating process. As a result, PN junction diodes are generated between the drains of the load TFT's and the nodes of the flip-flops. This reduces a voltage margin, to reduce the stabilization of cell operation and deteriorate the data retention characteristics. This will also be explained later in detail.

SUMMARY OF THE INVENTION

It is an object of the present invention to provide a SRAM cell having TFT's as loads with stabilization of the cell operation and improvement of the data retention characteristics.

According to the present invention, in a SRAM cell including two cross-coupled inverters having an input connected to a first node and an output connected to a second node, each inverter having a load TFT of a first conductivity type and a driving MOS transistor of a second conductivity type, a drain of each of the load TFT's is connected via a connection plug to the corresponding one of the first and second nodes. After the connection plug is formed, no high temperature heating process is carried out. Thus, no PN junction diodes are generated between the drains of the load TFT's and the nodes.

BRIEF DESCRIPTION OF THE DRAWINGS

The present invention will be more clearly understood from the description as set forth below, with reference to accompanying drawings, wherein.

2

Figure 5:
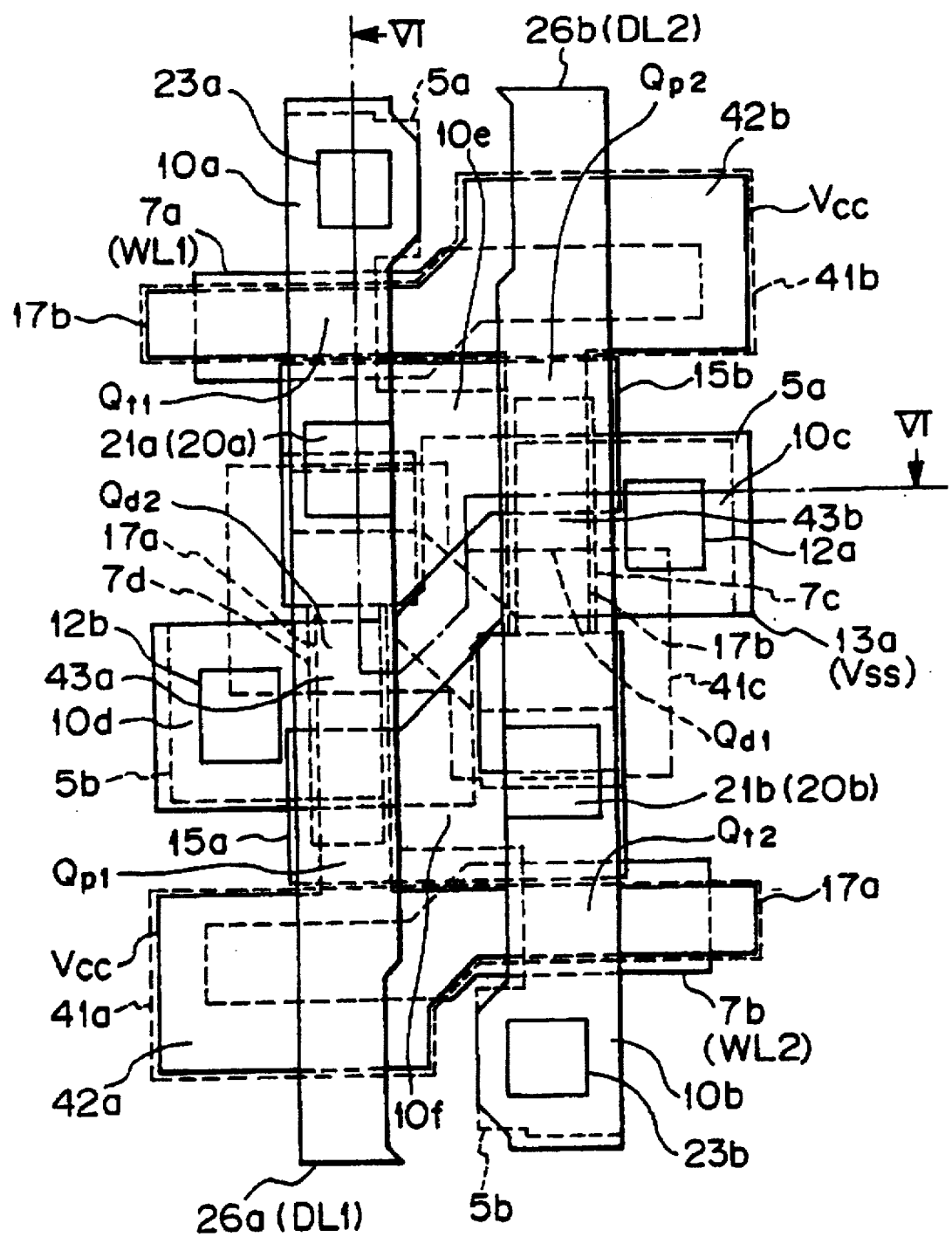
Figure 6:
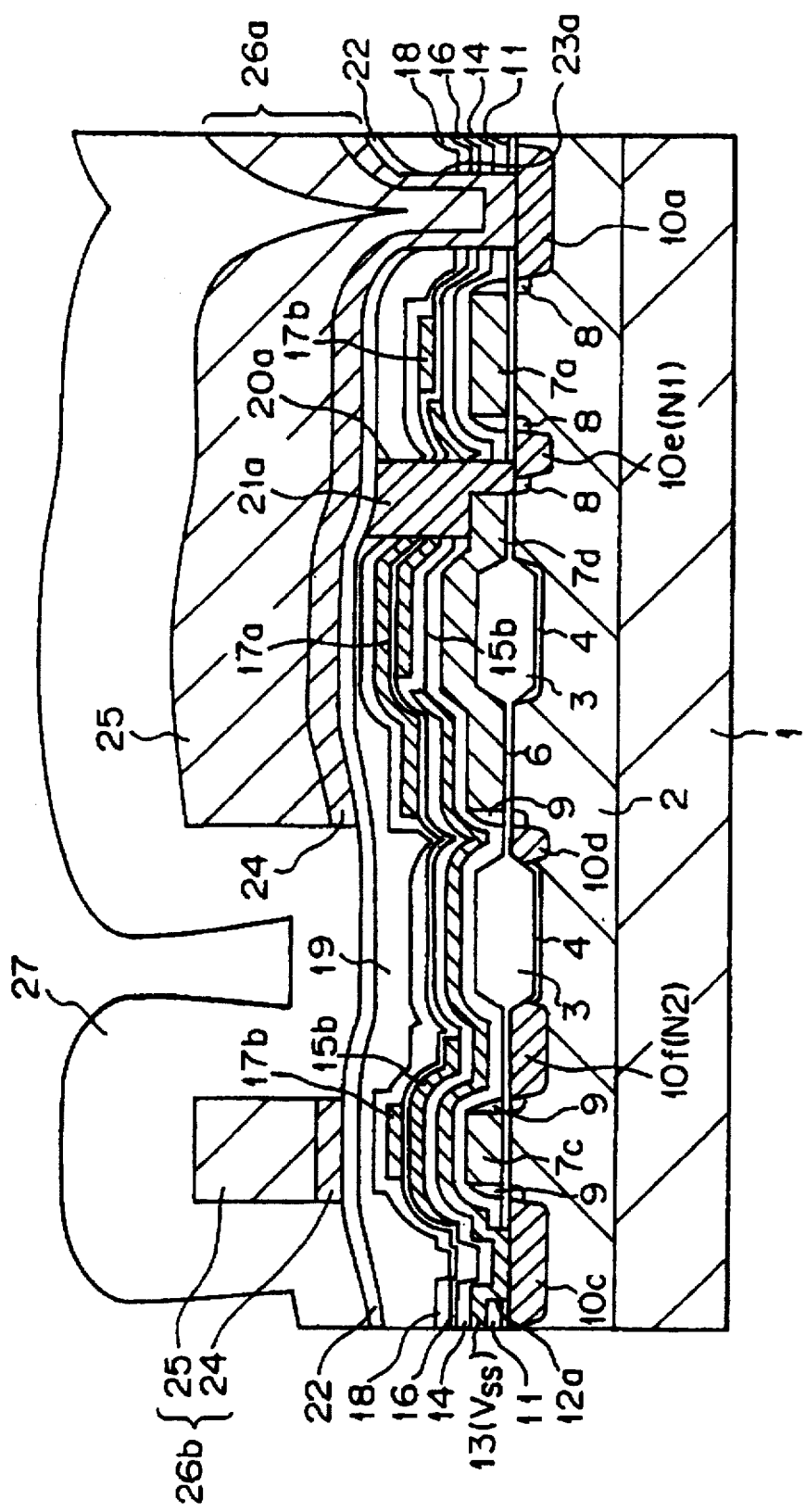
Figure 7:
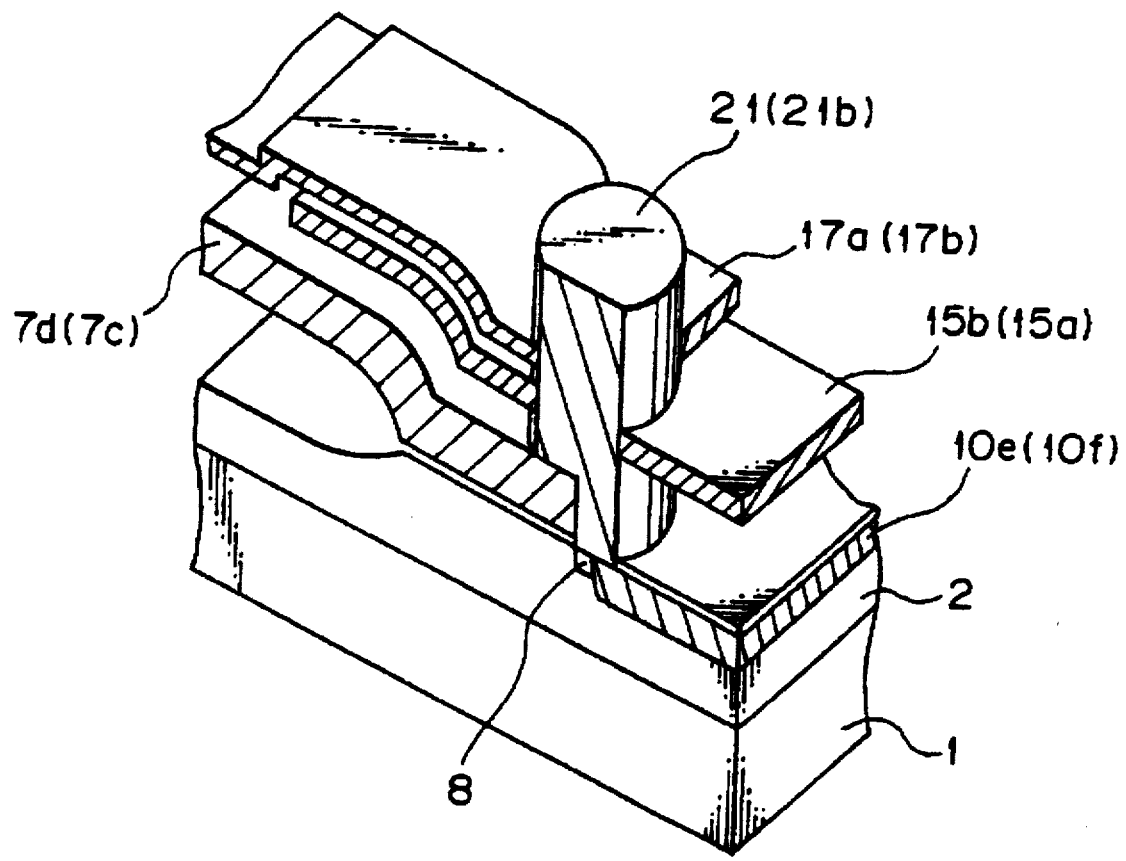

FIG. 5 is a plan view illustrating an embodiment of the SRAM cell according to the present invention;

FIG. 6 is a cross-sectional view of the SRAM cell of FIG. 5;

FIG. 7 is a partly-cut perspective view of the connection plug of FIG. 5; and

FIG. 6 is an equivalent circuit diagram of the SRAM cell of FIG. 5; and

FIGS. 9A through 9E are cross-sectional views for explaining the manufacturing steps of the SRAM cell of FIG. 5.

DESCRIPTION OF THE PREFERRED EMBODIMENT

Before the description of the preferred embodiment, a prior art SRAM cell will be explained with reference to FIGS. 1 through 4.

Figure 1:
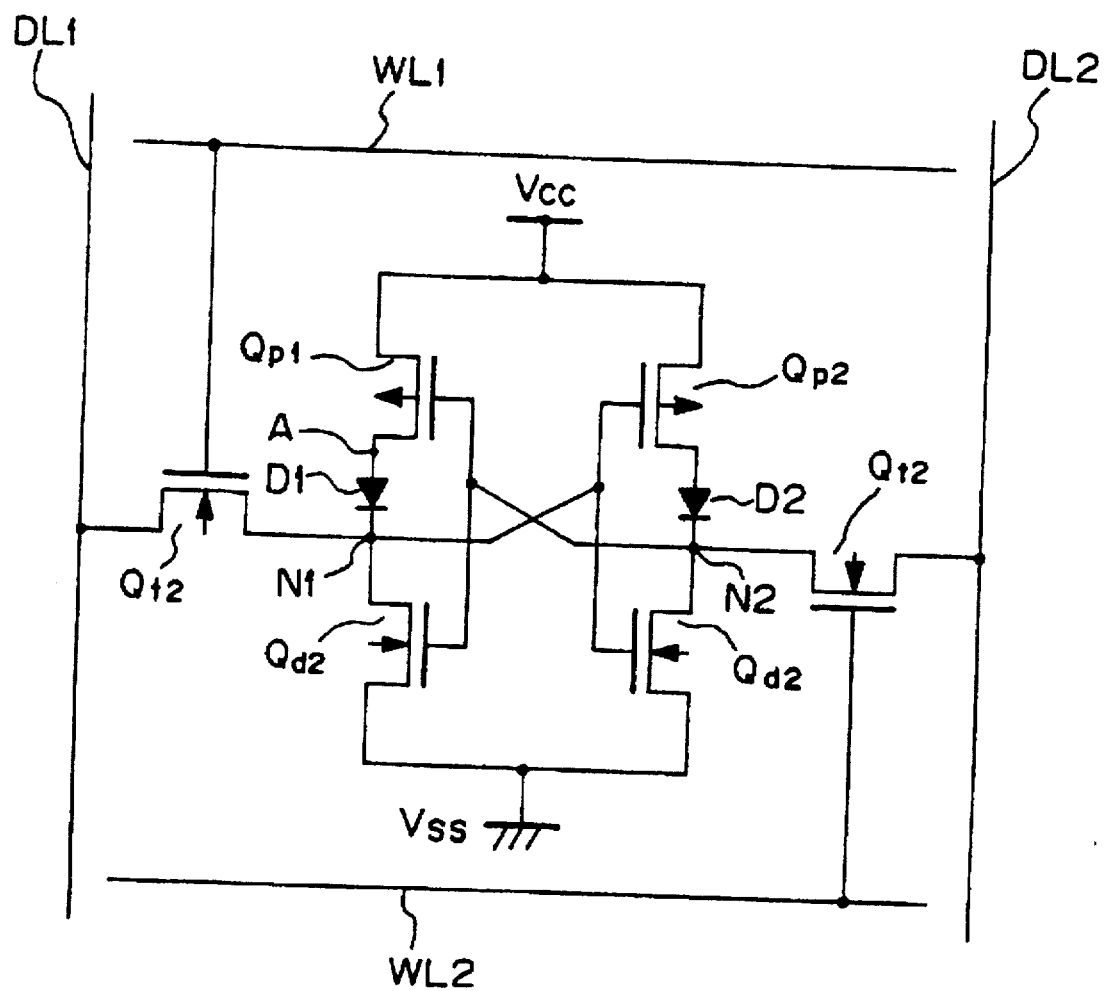
FIG. 1 is an equivalent circuit diagram illustrating a prior art SRAM cell.
Figure 1:
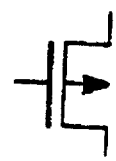
Figure 1:
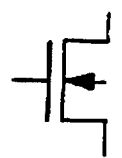

In FIG. 1, which is an equivalent circuit diagram illustrating a prior art SRAM cell, one memory cell is provided at each intersection between two word lines WL1 and WL2 and two complementary data lines DL1 and DL2. This memory cell is constructed by a flip-flop formed by two cross-coupled inverters, and two N-channel transfer MOS transistors $Q_{t1}$ and $Q_{t2}$ connected between the flip-flop and the data lines DL1 and DL2. The transfer transistors $Q_{t1}$ and $Q_{t2}$ are controlled by voltages at the word lines WL1 and WL2, respectively.

Each of the inverters includes a P-channel load TFT $Q_{p1}$ ($Q_{p2}$) and an N-channel driving bulk MOS transistor $Q_{d1}$ ($Q_{d2}$) between a power supply voltage line $V_{cc}$ and a ground voltage line $V_{ss}$.

Note that diodes D1 and D2 will be explained later.

When the voltages at the word lines WL1 and WL2 are made high, to turn ON the transfer transistors $Q_{t1}$ and $Q_{t2}$, data from the data lines DL1 and DL2 is written into nodes N1 and N2 of the flip-flop, or data is read from the nodes N1 and N2 to the data lines DL1 and DL2, respectively.

The structure of the SRAM cell of FIG. 1 is explained next with reference to FIG. 2 and FIG. 3 which is a cross-sectional view taken along the line III—III of FIG. 2.

Reference numeral 1 designates an N-type monocrystalline silicon substrate in which a P-type well 2 is formed. Also, reference numeral 3 designates a field silicon oxide layer, and 4 designates a channel stopper within the substrate 1 under the field silicon oxide layer 3.

The transfer transistors $Q_{t1}$ and $Q_{t2}$ and the driving transistors $Q_{d1}$ and $Q_{d2}$ are formed in active regions 5a and 5b of the P-well 2 surrounded by the field silicon oxide layer 3. Also, the transistors $Q_{t1}$ and $Q_{t2}$, $Q_{d1}$ and $Q_{d2}$ have gate electrodes 7a, 7b, 7c and 7d, respectively, on a gate silicon oxide layer 6, which electrodes are made of a first polycrystalline silicon layer.

The gate electrode 7d is connected to the active region 5a via a contact hole 31a. In this case, an N-type impurity region 32a is formed within the active region 5a beneath the contact hole 31a by using a thermal diffusion process. Similarly, the gate electrode 7c is connected to the active region 5b via a contact hole 31b. In this case, an N-type impurity region 32b (not shown) is formed within the active region 5b beneath the contact hole 31b by using the thermal diffusion process.

Provided with the active regions 5a and 5b are N-type impurity diffusion regions 8 which are manufactured with a mask of the gate electrodes 7a, 7b, 7c and 7d. Also, provided on the sides of the N-type impurity diffusion regions 8 are N⁺-type impurity diffusion regions 10a, 10b, 10c, 10d, 10e and 10f with a mask of the gate electrodes 7a, 7b, 7c, and 7d and their sidewall silicon oxide layers 9. In this case, a high temperature heating operation is carried out. Thus, lightly doped drain (LDD) structured MOS transistors are formed.

Note that the N⁺-type impurity diffusion regions 10e and 10f correspond to the nodes N1 and N2, respectively, of FIG. 1.

The impurity diffusion region such as 32a is connected to the N⁺-type impurity diffusion region such as 10d. Therefore, the gate electrode 7c of the driving transistor $Q_{d1}$ is connected to the N⁺-type impurity diffusion regions 10f, i.e., the node N2, and the gate electrode 7d of the driving transistor $Q_{d2}$ is connected to the N⁺-type impurity diffusion regions 10e, i.e., the node N1.

Also, reference numeral 11 designates a silicon oxide pattern layer on which a Ground voltage line layer 13 is formed. The ground voltage line layer 13 is made of a second polycrystalline silicon layer, and is connected to the N⁺-type impurity diffusion regions 10c and 10d at contact holes 12a and 12b, respectively.

Reference numerals 15a and 15b designate gate electrodes of the load TFT's $Q_{p1}$ and $Q_{p2}$, respectively, which are manufactured by a third polycrystalline silicon layer. Also, reference numerals 17a and 17b designate source/channel/drain regions of the load TFT's $Q_{p1}$ and $Q_{p2}$, respectively, which regions are manufactured by a fourth polycrystalline silicon layer on a gate silicon oxide layer 16.

The gate electrode 15a of the load TFT $Q_{p1}$ is connected to the gate electrode 7c of the driving transistor $Q_{d1}$ via a contact hole 33a. Also, the gate electrode 15b of the load TFT $Q_{p2}$ is connected to the gate electrode 7d of the driving transistor $Q_{d2}$ via a contact hole 33b.

P-type impurities are doped into the source/drain regions of the source/channel/drain regions 17a and 17b surrounded by 41a, 41b and 41c, to form a source 42a (42b) and a drain 43a (43b) of the load TFT $Q_{p1}$ ($Q_{p2}$). In this case, a high temperature heating process is carried out. The P⁺-type sources 42a and 42b serves as the power supply line $V_{cc}$ of FIG. 1.

The drain 43a of the load TFT $Q_{p1}$ is connected to the gate electrode 15b of the load TFT $Q_{p2}$ via a contact hole 34a, and the drain 43b of the load TFT $Q_{p2}$ is connected to the gate electrode 15a of the load TFT $Q_{p1}$ via a contact hole 34b.

Also, reference numeral 18 designates a silicon oxide layer, and 19 designates a boron-doped phosphosilicate glass (BPSG) layer. In this case, a high temperature heating operation is carried out to flatten the surface of the BPSG layer 19. Also, a metal connection layer 24 and an aluminum alloy layer 25 in combination form stacked layers 26a and 26b for the data lines DL1 and DL2, respectively. The stacked layers 26a and 26b are connected to the N⁺-type impurity diffusion regions 10a and 10b, respectively, via contact holes 23a and 23b.

Further, reference numeral 27 designates a passivation layer.

Figure 2:
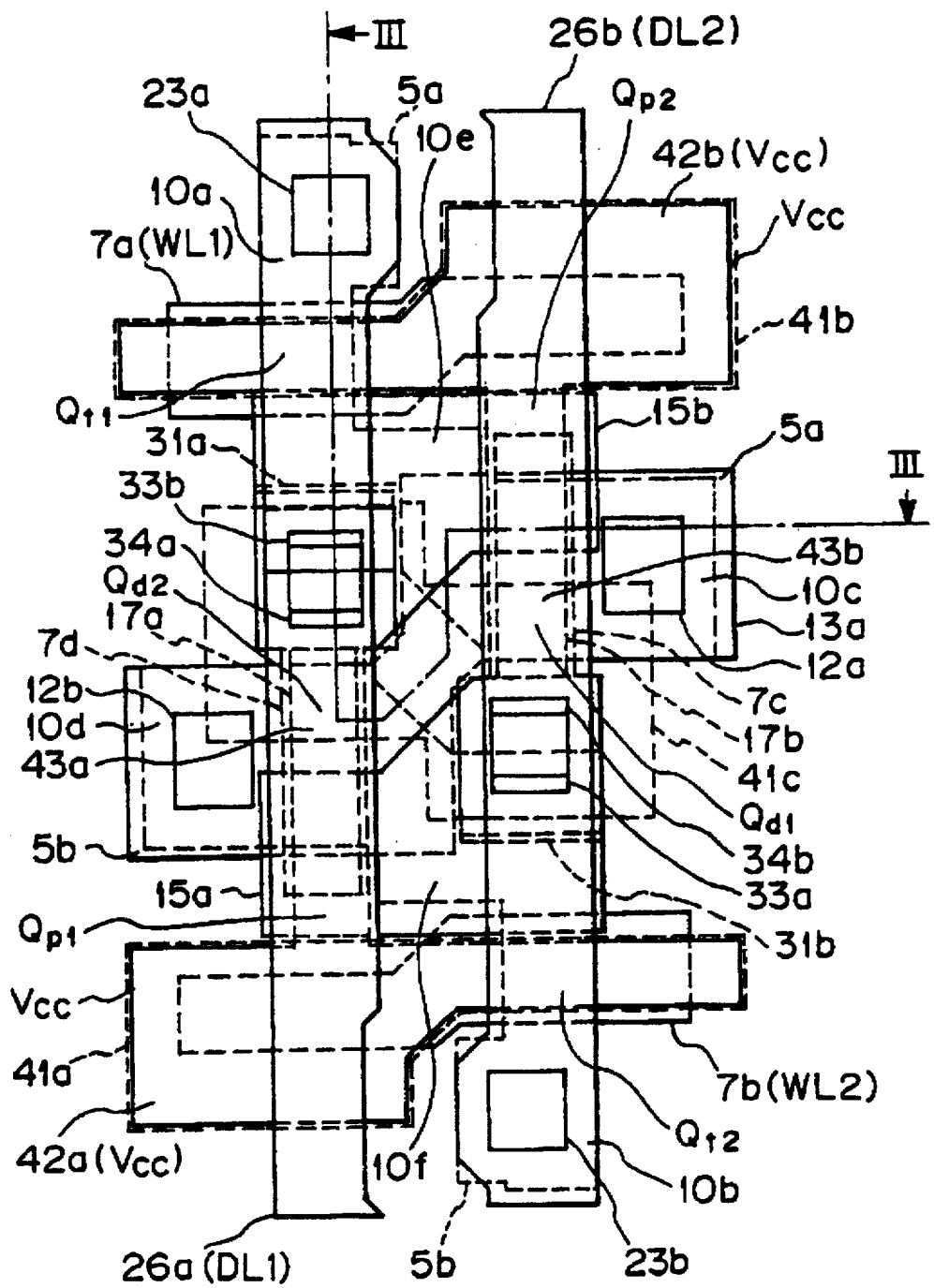
FIG. 2 is a plan view illustrating the SRAM cell of FIG. 1.
Figure 3:
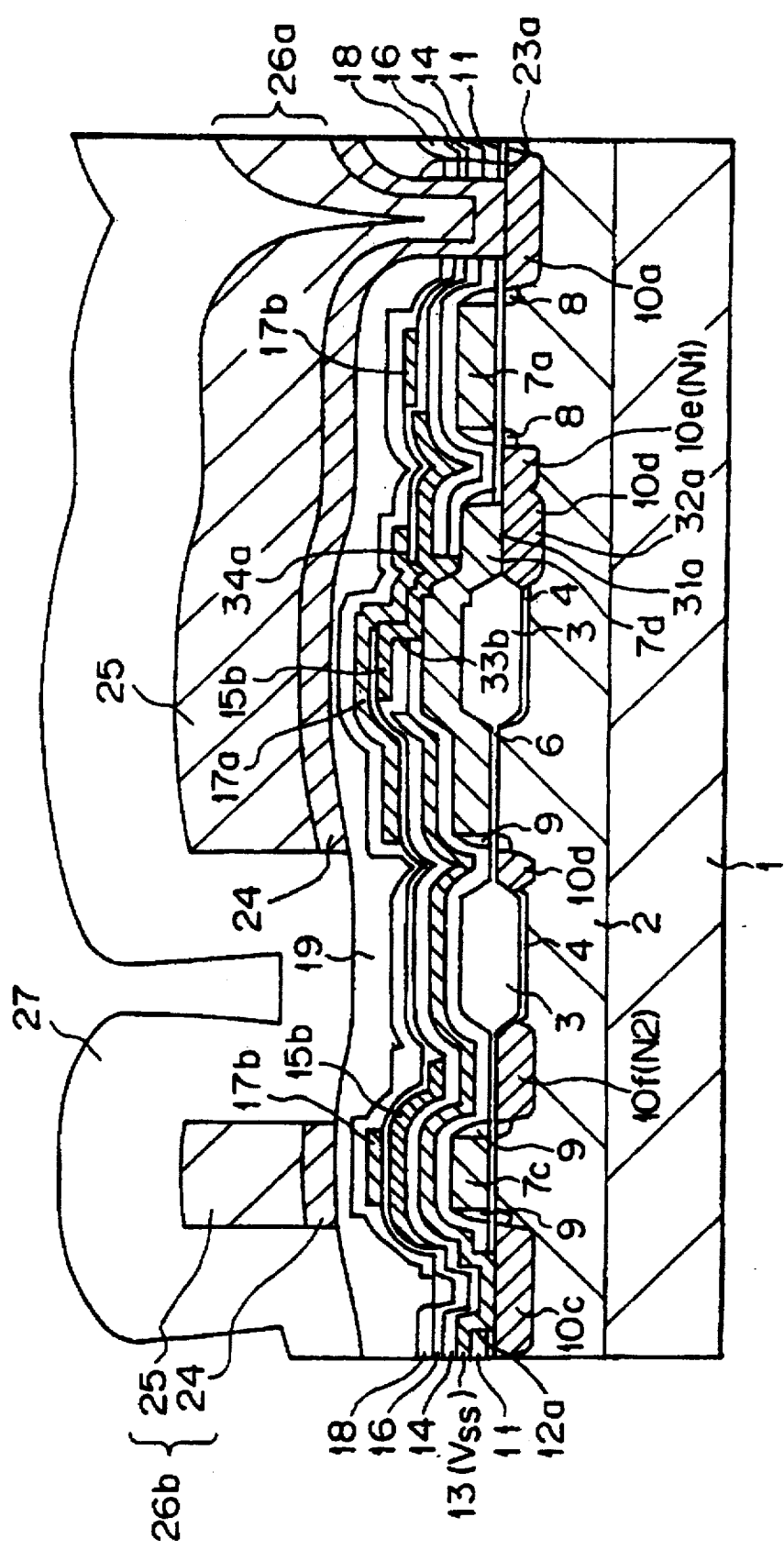
FIG. 3 is a cross-sectional view of the SRAM cell of FIG. 2.
Figure 4:
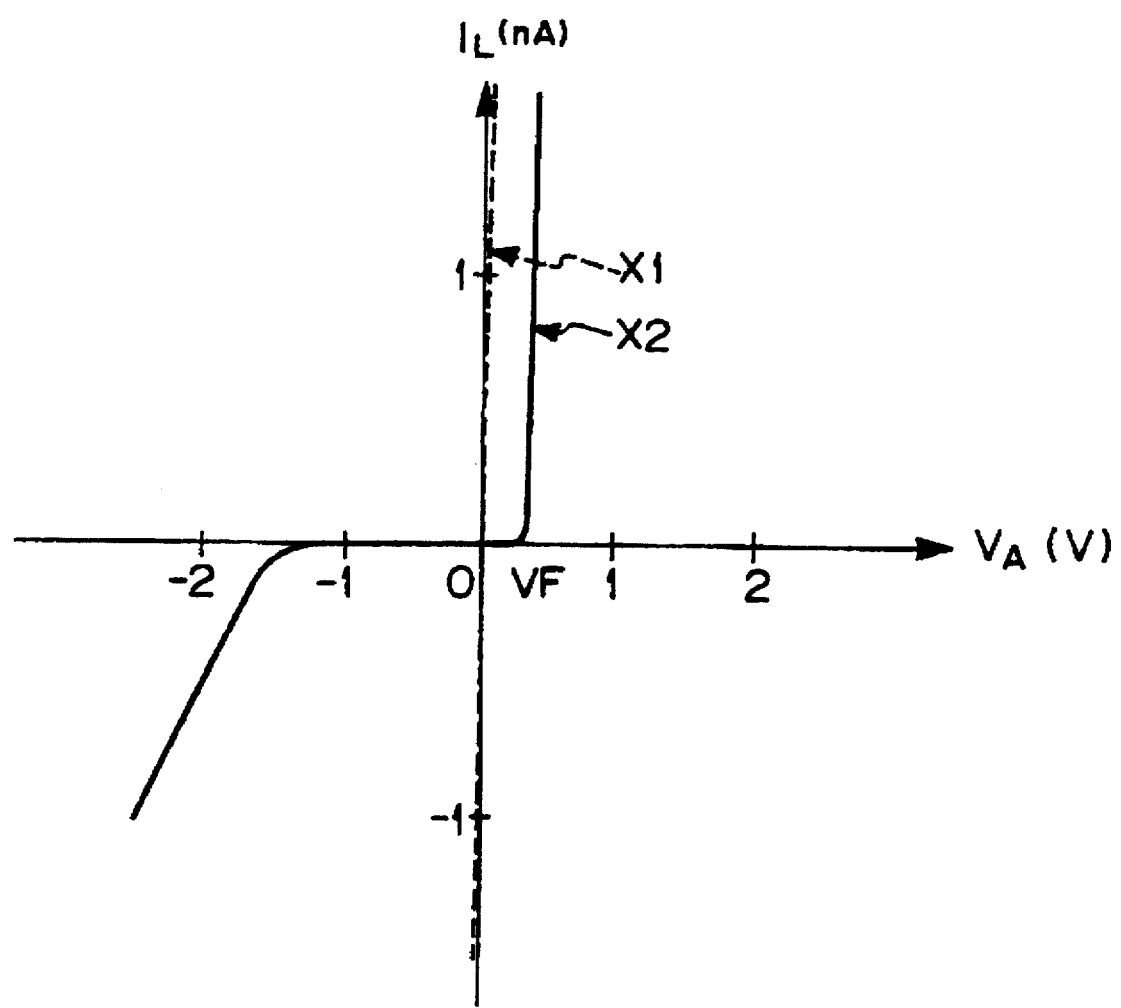
FIG. 4 is a graph showing the operation of the SRAM cell of FIG. 1.

In the SRAM cell as illustrated in FIGS. 2 and 3, however, PN junction diodes D1 and D2 as illustrated in FIG. 1 are created between the load TFT $Q_{p1}$ and $Q_{p2}$ and the nodes N1 and N2. That is, since the drain 43a of the load $Q_{p1}$ is of a P⁺-type, and the gate electrode 7d of the driving transistor $Q_{p2}$ is of an N⁺-type, the impurities within the drain 43a and the gate electrode 7d are rearranged by the high temperature heating process for flattening the BPSG layer 19, so that the PN junction diode D1 is generated at a path between the drain 43a of the load $Q_{p1}$ and the node N1, i.e., within the drain 43a, the contact hole 34a, the third polycrystalline layer 15b, the contact hole 33b or the gate electrode 7d. The PN junction diode D2 is generated in the same way as the PN junction diode D1.

The PN junction diodes D1 and D2 affect the operation of the SRAM cell. Assume that the PN junction diode D1 is connected between the drain A of the load TFT $Q_{p1}$ and the node N1 as illustrated in FIG. 1, and therefore, the PN junction diode D1 is forwardly biased. As indicated by X1 in FIG. 4, if the PN junction diode D1 is absent, when a current $I_L$ of about 500 pA flows therethrough, the voltage $V_A$ between the drain of the load TFT $Q_{p1}$ and the node N1, i.e., the voltage $V_A$ between the anode and cathode of the PN junction diode D1 is almost zero. Conversely, as indicated by X2 in FIG. 4, if the PN junction diode D2 is present, the voltage $V_A$ becomes a rise voltage VF of the PN junction diode D2, so that the voltage at the node N1 is decreased by VF as compared with the drain A of the load TFT $Q_{p1}$.

Incidently, a write operation for the SRAM cell is carried out by making the voltages at the word lines WL1 and WL2 high to turn ON the transfer transistors $Q_{t1}$ and $Q_{t2}$. For example, data "high level" is written from the data line DL1 into the node N1 and data "low level" is written from the data line DL2 into the node N2. However, in a state immediately after the word lines WL1 and WL2 are made low to turn OFF the transfer transistors $Q_{t1}$ and $Q_{t2}$, the data "high level" at the node N1 does not reach the $V_{cc}$ level. In this state, a current is supplied from the load TFT $Q_{p1}$ to the node N1, and after a certain definite time has passed, the data "high level" at the node N1 can reach the $V_{cc}$ level.

However, if the PN junction diode D1 is present between the drain A of the load transistor $Q_{p1}$ and the node N1, the data "high level" at the node N1 cannot reach the $V_{cc}$ level due to the voltage reduction of the PN junction diode D1, even after the certain definite time period has passed. Therefore, as compared with the case where the PN junction diode D1 is absent, a voltage margin between the data "high level" at the node N1 and the data "low level" at the node N2 becomes smaller, thus deteriorating the stabilization of the operation of the SRAM cell. This also remarkably deteriorates the data retention characteristics of the SRAM cell.

Particularly, when the power supply voltage $V_{cc}$ is low, for example, 2.0 V, the stabilization of the operation of the SRAM cell is further deteriorated, and the data retention characteristics of the SRAM cell are further deteriorated.

FIG. 5 is a plan view illustrating an embodiment of the SRAM cell according to the present invention, and FIG. 6 is a cross-sectional view taken along the line VI—VI of FIG. 5. As illustrated in FIGS. 5 and 6, connection plugs 21a and 21b are provided at contact holes 20a and 20b, respectively. That is, in more detail, as illustrated in FIG. 7, the N⁺-type impurity region 10e for the drain of the transfer transistor $Q_{t1}$, the drain of the driving transistor $Q_{d1}$ and the node N1, the gate electrode 7d of the driving transistor $Q_{d2}$, the gate electrode 15b of the load TFT $Q_{p2}$, and the drain 43a (17a) of the load TFT $Q_{p1}$ are connected to each other by the connection plug 21a. Similarly, the N⁺-type impurity region 10f for the drain of the transfer transistor $Q_{t2}$, the drain of the driving transistor $Q_{p2}$ and the node N2, the gate electrode 7c of the driving transistor $Q_{d1}$, the gate electrode 15a of the load TFT $Q_{p1}$, and the drain 43b (17b) of the load TFT $Q_{p2}$ are connected to each other by the connection plug 21b.

Figure 8:
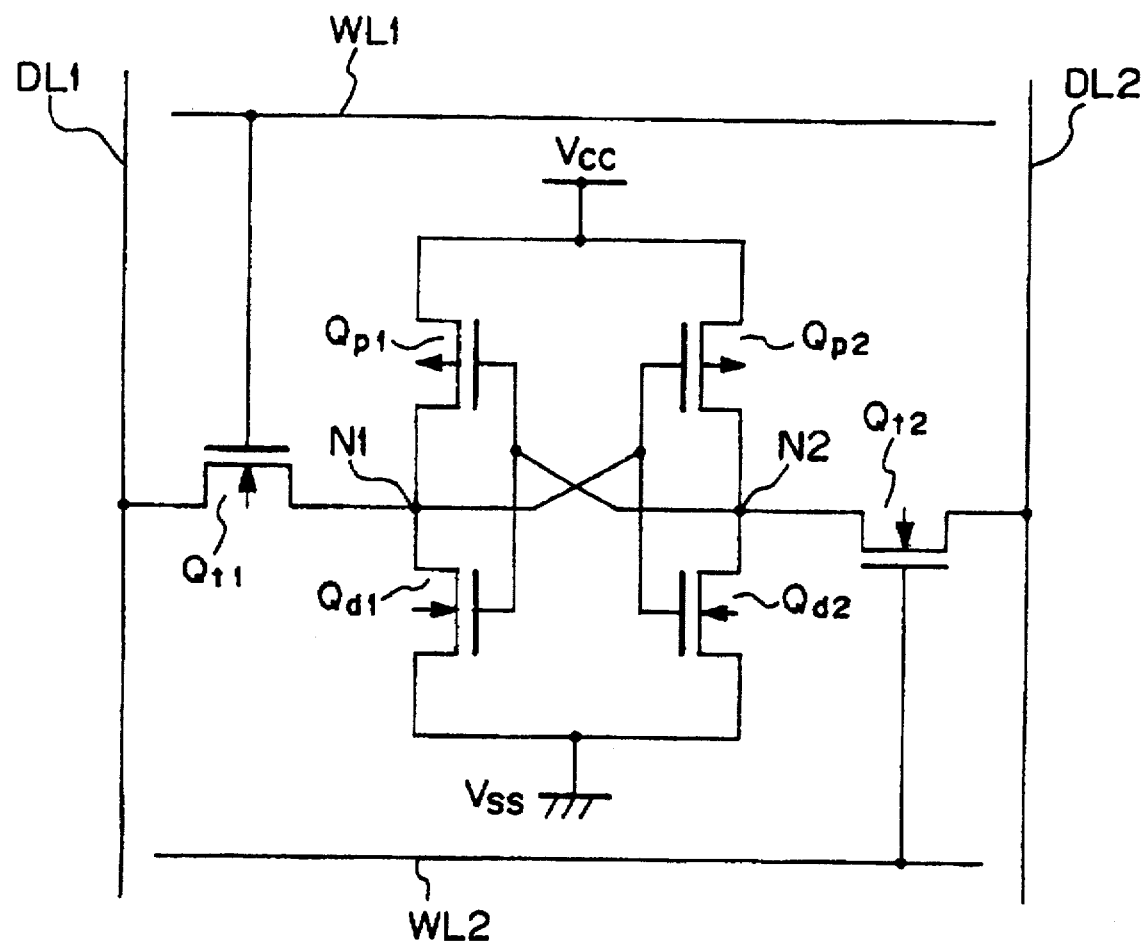

Due to the presence of the connection plugs 21a and 21b, the PN junction diodes D1 and D2 as illustrated in FIG. 1 do not appear between the drains of the load transistors $Q_{p1}$ and $Q_{p2}$, and therefore, the equivalent circuit of the SRAM cell of FIG. 5 is illustrated in FIG. 8.

The manufacturing steps of the SRAM cell of FIGS. 5 and 6 are explained next with reference to FIGS. 9A through 9E.

First, referring to FIG. 9A, a P-type well 2 having a concentration of about $10^{18}$ to $10^{19}$ borons/cm and a thickness of about 2 to 3 μm is formed by a thermal diffusion process in an N-type monocrystalline silicon substrate 1. Then, an about 400 to 500 nm thick field silicon oxide layer 3 is grown by thermally oxidizing the substrate 1 by using a local oxidation of silicon (LOCOS) process. In this case, a P-type channel stopper 4 is also formed beneath the field silicon oxide layer 3. Then, impurities such as about $10^{12}$ boron ions/cm are implanted at an energy of about 30 keV, to adjust the threshold voltage of the transistors $Q_{t1}$, $Q_{t2}$, $Q_{d1}$ and $Q_{d2}$.

Next, an about 10 to 15 nm thick gate silicon oxide layer 6 is grown by thermally oxidizing the substrate 1. The gate silicon oxide layer 6 serves as a gate insulating layer of the transfer transistors $Q_{t1}$ and $Q_{t2}$ and the driving transistors $Q_{d1}$ and $Q_{d2}$.

Next, referring to FIG. 9B, an about 200 nm thick first polycrystalline silicon layer is deposited by using a low pressure chemical vapor deposition (LPCVD) process, and N-type impurities such as phosphorous ions are doped thereinto by using a thermal diffusion process. Then, this first polycrystalline silicon layer is patterned by using a photolithography process and a dry etching process, to form the gate electrodes 7a, 7b, 7c (see FIG. 5) and 7d of the transistors $Q_{t1}$, $Q_{t2}$, $Q_{d1}$ and $Q_{d2}$, respectively. In this case, the gate electrodes 7a and 7b serve as the word lines WL1 and WL2, respectively.

Note the introduction of N-type impurities into the first polycrystalline silicon layer can be carried out by an ion implantation process or by a doping process simultaneously with the LPCVD process. Also, a polycide structure formed by silicide made of a high temperature melting metal such as tungsten or titanium and silicon, and polycrystalline silicon, can be used instead of the first polycrystalline silicon layer, to reduce the resistance Of the gate electrodes 7a, 7b, 7c and 7d.

Then, N-type impurities such as about $10^{13}$ phosphorous ions/cm are implanted at an energy of about 40 keV with am ask of the gate electrodes 7a, 7b, 7c and 7d, to form N-type impurity diffusion regions 8 within the substrate 1.

Then, an about 150 to 200 nm thick silicon oxide layer is deposited by using an LPCVD process, and this layer is patterned by an anisotropic dry etching process, to form sidewall silicon oxide layers 9 on the sides of the gate electrodes 7a, 7b, 7c and 7d. Then, N-type impurities such as about $10^{15}$ arsenic ions/cm are implanted at an energy of about 30 keV with a mask of the gate electrodes 7a, 7b, 7c and 7d and their sidewall silicon oxide layer 9, to form $N^+$-type impurity diffusion regions 10a through 10f within the substrate 1.

Then, a high temperature heating operation at about 800° to 900° C. for about 10 to 15 minutes is carried out to anneal the impurity implanted regions. Thus, the N-type impurity diffusion regions 8 and the $N^+$-type impurity diffusion regions 10a through 10f create LDD structured MOS transistors.

Then, an about 100 nm thick silicon oxide layer 11 is deposited on the entire surface by using an LPCVD process.

Next, referring to FIG. 9C, contact holes 12a and 12b (see FIG. 5) are perforated in the silicon oxide layer 11 by a photolithography process and a dry etching process.

Then, a second polycrystalline silicon layer 13 having a thickness of about 100 nm is deposited by an LPCVD process, and N-type impurities such as about $10^{16}$ arsenic ions/cm are implanted at an energy of about 20 keV, to reduce the resistance of the second polycrystalline silicon layer. This second polycrystalline silicon layer is patterned by a photolithgraphy process and a dry etching process, to form the ground voltage line $V_{ss}$. Then, the $N^+$-type impurity diffusion region 10c of the driving transistor $Q_{d1}$ is connected via the contact hole 12a to the ground voltage line $V_{ss}$, and the $N^+$-type impurity diffusion region 10d of the driving transistor $Q_{d2}$ is connected via the contact hole 12b to the ground voltage line $V_{ss}$. Also, a polycide structure formed by a high temperature melting metal such as tungsten or titanium and a silicide can be used instead of the second polycrystalline silicon layer 13, to reduce the resistance of the ground voltage line $V_{ss}$.

Then, an about 100 nm thick silicon oxide layer 14 is deposited on the entire surface by using an LPCVD process.

Then, a third polycrystalline silicon layer having a thickness of about 100 nm is deposited by using an LPCVD process, and N-type impurities such as about $10^{15}$ phosphorous ions/cm are implanted at an energy of about 20 keV thereinto, to reduce the resistance thereof. Then, the third polycrystalline silicon layer is patterned by using a photolithography process and a dry etching process, to form the gate electrodes 15a and 15b of the load TFT's $Q_{p1}$ and $Q_{p2}$. In this case, the gate electrodes 15a and 15b are of an N-type.

If P-type impurities such as about $10^{15}$ boron ions/cm are implanted into the third polycrystalline silicon layer, the gate electrodes 15a and 15b can be of a P-type.

Then, an about 20 to 30 nm thick silicon oxide layer 16, which serves as the gate insulating layers of the TFT's $Q_{p1}$ and $Q_{p2}$ is deposited on the entire surface by using an LPCVD process.

Then, an about 50 nm thick amorphous silicon layer is deposited by using a source gas of $SiH_6$, and is annealled in a nitrogen atmosphere at a temperature of about 600° C. for 3 to 12 hours, to form a fourth polycrystalline silicon layer. Then, N-type impurities such as about $10^{12}$ phosphorous ions/cm are implanted thereinto, to adjust the threshold voltage of the load TFT's $Q_{p1}$ and $Q_{p2}$. Then, the fourth polycrystalline silicon layer is patterned by using a photolithography process and a dry etching process, to form the source/channel/drain regions 17a and 17b of the load TFT's $Q_{p1}$ and $Q_{p2}$. In this case, a part of the regions 17a and 17b serve as the power supply line $V_{cc}$. Then, a photoresist pattern indicated by 41a, 41b and 41c in FIG. 5 is formed, and P-type impurities such as about $10^{15}$ $BF_2$ ions/cm are implanted at an energy of about 40 keV. As a result, a region 42a of the region 17a overlapped by the pattern 41a forms a source of the load TFT $Q_{p1}$, and a region 43a of the region 17a overlapped by the pattern 41c forms a drain of the load TFT $Q_{p1}$. Similarly, a region 42b of the region 17b overlapped by the pattern 41b forms a source of the load TFT $Q_{p2}$, and a region 43b of the region 17b overlapped by the pattern 41c forms a drain of the load TFT $Q_{p1}$. Also, a part of the regions 42a and 42b serve as the power supply line $V_{cc}$.

Figure 9D:
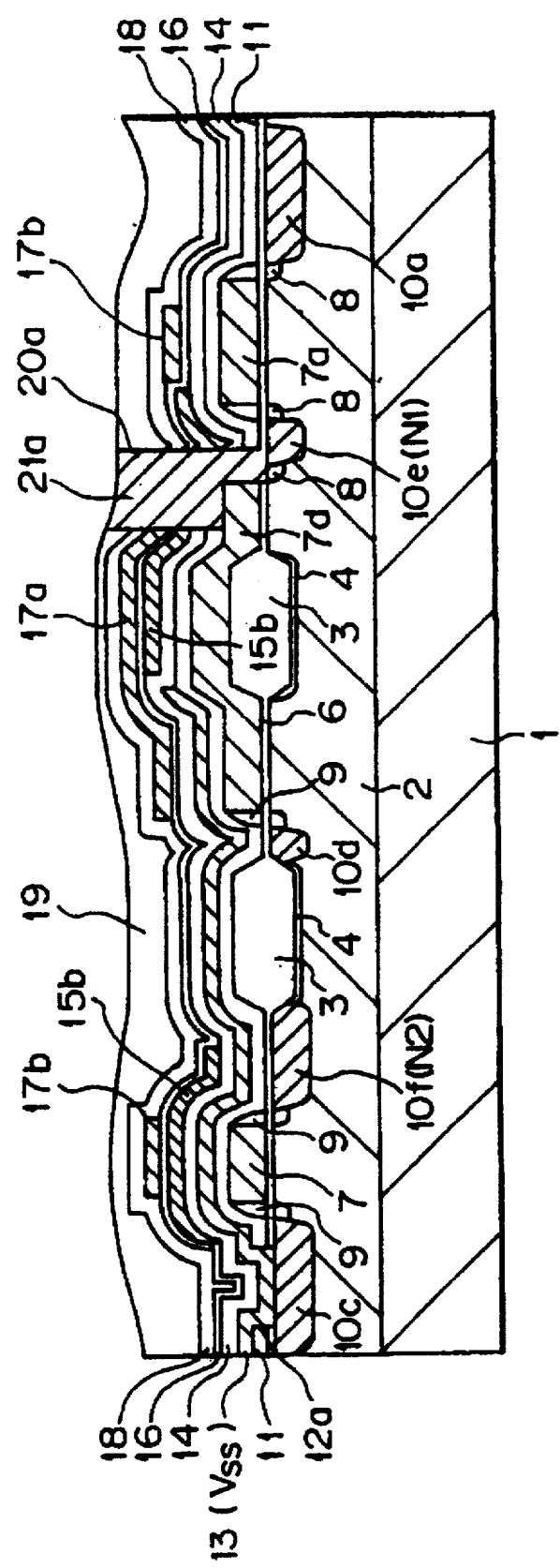

Next, referring to FIG. 9D, an about 100 nm thick silicon oxide layer 18 is formed on the entire surface by using an LPCVD process, and an about 300 nm thick BPSG layer 19 is formed on the entire surface by using an LPCVD process. Then, a heat operation at a temperature of about 800° to 900° C. for about 10 to 15 minutes is carried out to reflow the BPSG layer 19, i.e., flatten the surface of the BPSG layer 19. As a result of this heating operation, the source regions 42a and 42b and the drain regions 43a and 43b of the regions 17a and 17b are also annealled.

Note that the silicon oxide layer 18 serves as an impurity diffusion preventing layer for preventing impurities such as boron and phosphorus of the BPSG layer 19 from being diffused into the layers beneath the silicon oxide layer 18.

Then, contact holes 20a and 20b are perforated in the layers 19, 18, 17a (17b), 16, 15a (15b), 14, 11 and 6 by using a photolithography process and a dry etching process. In this case, the dry etching process etches silicon oxide and polycrystalline silicon.

Then, connection plugs 21a and 21b are formed. That is, a high temperature melting point metal layer made of tungsten, for example, is deposited by using a LPCVD process. In this case, the thickness of the tungsten layer is about the same as the depth of the contact holes 20a and 20b. After that, the tungsten layer is etched back by using an anisotropic dry etching process, so that the tungsten layer is left only within the contact holes 20a and 20b. Thus, the connection plug 21a for electrically connecting the first polycrystalline silicon layer 7d, the third polycrystalline silicon layer 15b and the fourth polycrystalline silicon layer 17a to each other is formed, and the connection plug 21b for electrically connecting the first polycrystalline silicon layer 7c, the third polycrystalline silicon layer 15a and the fourth polycrystalline silicon layer 17b to each other is formed. In more detail, the connection plug 21a connects the N$^+$-type impurity diffusion region 10e for the N$^+$-type impurity diffusion region of the transfer transistor $Q_{t1}$, the drain of the driving transistor $Q_{p1}$ and the node N1, the gate electrode 7d of the driving transistor $Q_{d2}$, the gate electrode 15b of the load TFT $Q_{p2}$, and the drain 43a of the load TFT $Q_{p1}$ to each other. Similarly, the connection plug 21b connects the N$^+$-type impurity diffusion region 10f for the N$^+$-type impurity diffusion region of the transfer transistor $Q_{t2}$, the drain of the driving transistor $Q_{d2}$ and the node N2, the gate electrode 7c of the driving transistor $Q_{d1}$, the gate electrode 15a of the load TFT $Q_{p1}$, and the drain 43b of the load TFT $Q_{p2}$ to each other.

Then, in order to reduce the contact resistance between the connection plugs 21a (21b) and the polycrystalline silicon layers 7d, 15b and 17a (7c, 15a and 17b), a heat operation at a relatively low temperature such as 600° C. is carried out in a nitrogen atmosphere. In this case, a rearrangement between the N-type impurities included in the regions 10e (10f), the first polycrystalline silicon layer 15b (15a), and the third polycrystalline silicon layer 15b (15a) which is, in this case, of N-type and P-type impurities included in the fourth polycrystalline silicon layer 17a (17b) and the third polycrystalline silicon layer 15b (15a) which is, in this case, of a P-type, hardly occurs, since the temperature of the heat operation is low. Thus, no PN junction diode is created therebetween.

Next, referring to FIG. 9E, an about 100 nm thick silicon oxide layer 22 is formed by using an LPCVD process, and contact holes 23a and 23b (see FIG. 5) are perforated in the layers 22, 18, 16, 14 and 11 by using a photolithography process and a dry etching process.

Then, a barrier metal layer 24 and an aluminum alloy layer 25 are formed. In this case, the barrier metal layer 24 is formed by an about 100 to 200 nm thick high temperature melting point metal layer made of tungsten, for example, manufactured by a sputtering process. The aluminum alloy layer 25 is made of sputtered Cu or Si added aluminum which is about 600 to 800 nm thick. The barrier metal layer 24 and the aluminum alloy layer 25 are patterned by a photolithography process and a dry etching process, to form the data lines 26a (DL1) and 26b (DL2).

Finally, a passivation layer 27 is formed on the entire surface, to complete the SRAM cell of FIGS. 5 and 6.

Thus, in the above-mentioned embodiment, the N$^+$-type impurity region 10e (10f) and the first polycrystalline silicon layer 7d (7c) are connected to the bottom portions of the connection plug 21a (21b), and the third polycrystalline silicon layer 15b (15a) and the polycrystalline silicon layer 17a (17b) are connected to the side portions of the connection plug 21a (21b). Therefore, the N$^+$-type impurity region 10e (10f) and the polycrystalline silicon layers 7d (7c), 15b (15a) and 17a (17b) are electrically connected to each other by the connection plug 21a (21b).

Also, since the connection plug 21a (21b) is formed after the high temperation heating operation for flattening the surface of the BPSG layer 19, rearrangement between the N-type impurities (7d, 7c, 10e, 10f) and the P-type impurities (17a, 17b) hardly occurs, so that the PN junction diodes D1 and D2 of FIG. 1 do not appear. Therefore, the adverse effect to the SRAM cell by the PN junction diodes D1 and D2 of FIG. 1 is eliminated, to stabilize the operation of the SRAM cell and exhibit excellent data retention characteristics.

Further, the steps for perforating the contact holes 31a, 31b, 33a, 33b, 34a and 34b in the prior art SRAM cell can be reduced by the step for forming the connection plugs 21a and 21b, thus remarkably reducing the manufacturing cost.

In the above-mentioned embodiment, although the fourth polycrystalline silicon layer (17a, 17b) is located on the third polycrystalline silicon layer (15a, 15b), the third polycrystalline silicon layer can be located on the fourth polycrystalline silicon layer. In other words, the source, channel and drain of the load TFT's ($Q_{p2}$) and the power supply line $V_{cc}$ can be formed in the third polycrystalline silicon layer 15a (15b), and the gate electrode of the load TFT's $Q_{p1}$ ($Q_{p2}$) can be formed in the fourth polycrystalline silicon layer 17a (17b).

As explained hereinbefore, according to the present invention, since PN junction diodes are excluded from a SRAM cell, the operation of the SRAM cell can be stabilized, and the data retention characteristics of the SRAM cell can be improved. Also, the manufacturing cost can be remarkably reduced.

I claim:

1. A static random access memory device comprising:
   first and second power supply lines;
   first and second connection plugs;
   a first load thin film transistor connected between said first power supply line and said first connection plug;
   a second load thin film transistor connected between said first power supply line and said second connection plug;
   a first driving MOS transistor connected between said first connection plug and said second power supply line; and
   a second driving MOS transistor connected between said second connection plug and said second power supply line,
   wherein said first connection plug is connected between a drain of said first load thin film transistor and said first driving MOS transistor such that said drain of said first load thin film transistor does not directly contact said first driving MOS transistor and wherein said first connection plug penetrates said drain of said first load thin film transistor, and wherein said second connection plug is connected between a drain of said second load thin film transistor and said second driving MOS transistor such that said drain of said second load thin film transistor does not directly contact said second driving MOS transistor and wherein said second connection plug penetrates the drain of said second load thin film transistor.

2. A device as set forth in claim 1, wherein said first and second connection plugs serve as first and second cross connection lines, respectively;

said first cross connection line being between said drain of said first load thin film transistor and gates of said second load thin film transistor and said second driving MOS transistor; and said second cross connection line being between said drain of said second load thin film transistor and gates of said first load thin film transistor and said first driving MOS transistor.

3. A static random access memory device comprising:

first and second power supply lines;

first and second connection plugs;

a first load thin film transistor connected between said first power supply line and said first connection plug;

a second load thin film transistor connected between said first power supply line and said second connection plug;

a first driving MOS transistor connected between said first connection plug and said second power supply line;

a second driving MOS transistor connected between said second connection plug and said second power supply line;

a first cross connection line between a drain of said first load thin film transistor and gates of said second load thin film transistor and said second driving MOS transistor;

a second cross connection line between a drain of said second load thin film transistor and gates of said first load thin film transistor and said first driving MOS transistor;

a semiconductor substrate of a first conductivity type;

first and second impurity regions of a second conductivity type opposite said first conductivity type, said first and second impurity regions being formed within said semiconductor substrate and being electrically connected to said first and second connection plugs, respectively;

first and second conductive layers formed above said semiconductor substrate and serving as source/channel/drain regions of said first and second load thin film transistors, respectively;

wherein said first connection plug is connected between said first conductive layer and said first impurity region such that said drain of said first load thin film transistor does not directly contact said first impurity region and wherein said first connection plug penetrates said first conductive layer; and wherein said second connection plug is connected between said second conductive layer and said second impurity region such that said drain of said second load thin film transistor does not directly contact said second impurity region and wherein said second connection plug penetrates said second conductive layer.

4. A device as set forth in claim 3, wherein said first and second connection plugs serve as said first and second cross connection lings, respectively.

5. A static random access memory device comprising:

first and second power supply lines;

first and second nodes;

a first load thin film transistor connected between said first power supply line and said first node;

a second load thin film transistor connected between said first power supply line and said second node;

a first driving MOS transistor connected between said first node and said second power supply line;

a second driving MOS transistor connected between said second node and said second power supply line;

a first cross connection line between said first node and gates of said second load thin film transistor and said second driving MOS transistor;

a second cross connection line between said second node and gates of said first load thin film transistor and said first driving MOS transistor;

a semiconductor substrate of a first conductivity type;

first and second impurity regions of a second conductivity type opposite said first conductivity type, said first and second impurity regions being formed within said semiconductor substrate and serving as said first and second nodes, respectively;

first and second conductive layers formed above said semiconductor substrate and serving as gate electrodes of said first and second driving MOS transistors, respectively;

third and fourth conductive layers formed above said first and second conductive layers and serving as source/channel/drain regions of said first and second thin film transistors, respectively;

a first connection plug connected to said first impurity region and said second and third conductive layers, said first connection plug penetrating said second and third conductive layers; and a second connection plug connected to said second impurity region and said first and fourth conductive layers, said second connection plug penetrating said first and fourth conductive layers.

6. A device as set forth in claim 5, wherein said first and second connection plugs serve as said first and second cross connection lines, respectively.

7. A static random access memory device comprising:

first and second power supply lines;

first and second nodes;

a first load thin film transistor connected between said first power supply line and said first node;

a second load thin film transistor connected between said first power supply line and said second node;

a first driving MOS transistor connected between said first node and said second power supply line;

a second driving MOS transistor connected between said second node and said second power supply line;

a first cross connection line between said first node and gates of said second load thin film transistor and said second driving MOS transistor;

a second cross connection line between said second node and gates of said first load thin film transistor and said first driving MOS transistor;

a semiconductor substrate of a first conductivity type;

first and second impurity regions of a second conductivity type opposite said first conductivity type, said first and second impurity regions being formed within said semiconductor substrate and serving as said first and second nodes, respectively;

first and second conductive layers formed above said semiconductor substrate and serving as gate electrodes of said first and second driving MOS transistors, respectively;

third and fourth conductive layers formed above said first and second conductive layers and serving as gate electrodes of said first and second thin film transistors, respectively;

fifth and sixth conductive layers formed above said first and second conductive layers and serving as source/channel/drain regions of said first and second thin film transistors, respectively;

a first connection plug connected to said first impurity region and said second, fourth and fifth conductive layers, said first connection plug penetrating said second, fourth and fifth conductive layers; and a second connection plug connected to said second impurity region and said first, third and sixth conductive layers, said second connection plug penetrating said first, third and sixth conductive layers.

8. A device as set forth in claim 7, wherein said third and fourth conductive layers are beneath said fifth and sixth conductive layers.

9. A device as set forth in claim 7, wherein said third and fourth conductive layers are above said fifth and sixth conductive layers.

10. A device as set forth in claim 7, wherein said first and second connection plugs serve as said first and second cross connection lines, respectively.

11. The static random access memory as claimed in claim 1, wherein said first connection plug is connected between said drain of said first load thin film transistor and a drain of said first driving MOS transistor such that said drain of said first load thin film transistor does not directly contact said drain of said first driving MOS transistor, and wherein said second connection plug is connected between said drain of said second load thin film transistor and a drain of said second driving MOS transistor such that said drain of said second load thin film transistor does not directly contact said drain of said second driving MOS transistor.

12. The static random access memory as claimed in claim 11, wherein said first and second connection plugs serve as first and second cross connection lines, respectively;

said first cross connection line being between said drain of said first load thin film transistor and gates of said second load thin film transistor and said second driving MOS transistor;

said second cross connection line being between said drain of said second load thin film transistor and gates of said first load thin film transistor and said first driving MOS transistor;

said gates of said second load thin film transistor and said second driving MOS transistor being connected to said first cross connection line such that said drain of said first load thin film transistor is not directly connected to said gates of said second load thin film transistor and said second driving MOS transistor; and said gates of said first load thin film transistor and said first driving MOS transistor being connected to said second cross connection line such that said drain of said second load thin film transistor is not directly connected to said gates of said first load thin film transistor and said first driving MOS transistor.

13. The static random access memory as claimed in claim 12, wherein said gates of said first load thin film transistor and said first driving MOS transistor are not directly connected to said drain of said second driving MOS transistor and wherein said gates of said second load thin film transistor and said second driving MOS transistor are not directly connected to said drain of said first driving MOS transistor.

* * * * *